(12) United States Patent
Khalid

(10) Patent No.: US 8,062,957 B2
(45) Date of Patent: Nov. 22, 2011

(54) SEMICONDUCTOR SUBSTRATE SURFACE PREPARATION METHOD

(75) Inventor: Radouane Khalid, Montbonnot Saint Martin (FR)

(73) Assignee: S.O.I.Tec Silicon on Insulator Technologies, Bernin (FR)

(*) Notice: Subject to any disclaimer, the term of this patent is extended or adjusted under 35 U.S.C. 154(b) by 0 days.

(21) Appl. No.: 12/867,217

(22) PCT Filed: Jan. 23, 2009

(86) PCT No.: PCT/IB2009/000141
§ 371 (c)(1),
(2), (4) Date: Oct. 21, 2010

(87) PCT Pub. No.: WO2009/101494
PCT Pub. Date: Aug. 20, 2009

(65) Prior Publication Data
US 2011/0053342 A1   Mar. 3, 2011

(30) Foreign Application Priority Data

Feb. 13, 2008   (EP) .................................. 08290138

(51) Int. Cl.
*H01L 21/00* (2006.01)
*H01L 21/331* (2006.01)
*H01L 21/46* (2006.01)
*H01L 21/30* (2006.01)
*H01L 21/322* (2006.01)

(52) U.S. Cl. ............ 438/455; 438/9; 438/311; 438/474; 438/475; 257/E21.088; 257/E21.122; 257/E21.218; 257/E21.567

(58) Field of Classification Search ........... 257/E21.088, 257/E21.122, E21.218, E21.567
See application file for complete search history.

(56) References Cited

U.S. PATENT DOCUMENTS

| | | | | |
|---|---|---|---|---|
| 5,238,865 A | * | 8/1993 | Eguchi | 438/406 |
| 5,439,843 A | * | 8/1995 | Sakaguchi et al. | 438/459 |
| 5,493,859 A | * | 2/1996 | Shinohara et al. | 60/302 |
| 6,007,641 A | | 12/1999 | Vines et al. | 134/26 |
| 6,020,254 A | | 2/2000 | Taguwa | 438/618 |
| 6,066,572 A | | 5/2000 | Lu et al. | 438/774 |
| 6,709,989 B2 | * | 3/2004 | Ramdani et al. | 438/763 |
| 6,911,375 B2 | * | 6/2005 | Guarini et al. | 438/455 |
| 2007/0023066 A1 | | 2/2007 | Yokokawa et al. | 134/1.3 |

FOREIGN PATENT DOCUMENTS

EP   1 667 214 A1   6/2006

OTHER PUBLICATIONS

European Search Report, EP 08290138 dated Jul. 28, 2008.
International Search Report, PCT/IB2009/000141, mailed Jun. 23, 2009.
Tong et al, XP-002530619 "The Role of Surface Chemistry in Bonding of Standard Silicon Wafers", Journal of Electrochemical Society, vol. 144, No. 1, pp. 384-389, (1997).
Ljungberg et al., "Modification of Silicon Surfaces with $H_2SO_4:H_2O_2$:HF and $HNO_3$:HF for Wafer Bonding Applications", Journal of Electrochemical Society, vol. 143, No. 5,pp. 1709-1714 (1996).
Inomata C.R., et al., "Infrared Spectroscopy Study of Chemical Oxides Formed by a Sequence of RCA Standard Cleaning Treatments", Journal of Electrochemical Society, vol. 143, No. 9, pp. 2995-3000 (1996).
M. Alessandri et. al.XP000974924"Particle Removal Efficiency and Silicon Roughness in HF-DIW/$O_3$/Megasonics Cleaning", Solid State Phenomena, vols. 65-66, pp. 27-30 (1999).
Q.-Y. Tong et al., Extracts of "Semiconductor on Wafer Bonding: Science and Technology," John Wiley & Sons, Inc. (no date).

* cited by examiner

*Primary Examiner* — Mohsen Ahmadi
(74) *Attorney, Agent, or Firm* — Winston & Strawn LLP

(57) ABSTRACT

The invention relates to a method for preparing a surface of a semiconductor substrate by oxidizing the surface of the semiconductor substrate to thereby transform the natural oxide into an artificial oxide and then removing the artificial oxide, in particular to obtain an oxide-free substrate surface.

3 Claims, 5 Drawing Sheets

SEMICONDUCTOR SUBSTRATE SURFACE PREPARATION METHOD

This application is a 371 filing of International Patent Application PCT/IB2009/000141 filed Jan. 23, 2009.

BACKGROUND

The invention relates to a method for preparing the surface of a semiconductor substrate, in particular to a method providing an oxide-free semiconductor substrate surface.

For certain applications, it is necessary to provide semiconductor substrates from which the natural oxide layer has been removed. One such situation, for example, appears in the so called. Direct Silicon Bonding (DSB) technology during which typically a silicon (100) surface of a first substrate is directly bonded to a silicon (110) surface of a second substrate without intervening oxide layer. To be able to successfully bond the two substrates, it is important to remove all possible sources of oxygen or oxide at the bonding interface to prevent the creation of oxide or oxygen precipitates which would delimit the quality of the obtained DSB substrate. For example, the presence of such precipitates or oxides at the bonding surface would be responsible for low bonding energies, leading to insufficient adhesion between the two bonded substrates.

The same kind of problem occurs during the process of forming a strained silicon layer. To produce a strained silicon layer, one typically starts from a single crystal silicon support substrate on which a relaxed silicon germanium (SiGe) layer is produced via a buffer layer. This buffer layer is an intermediate layer between two crystallographic structures with different lattice parameters, having in the region of one interface, a lattice parameter substantially identical to that of the first structure (the silicon substrate) and in the region of its other interface, a lattice parameter substantially identical to that of the second structure (the relaxed SiGe layer). Typically, the buffer layer is a SiGe layer in which the germanium content progressively or in steps increases through the thickness. Then, on the relaxed buffer layer, a thin second layer is grown (typically with a thickness of about 200 Å) which adapts its lattice constants to the one of the underlying relaxed SiGe layer and becomes a strained Silicon layer (sSi). Like in the previous situation, the crystalline quality of the strained silicon layer is negatively influenced by the presence of oxygen or oxides on the surface of the relaxed SiGe layer.

In the prior art, the solution to the above-described problem consists in an HF treatment, which leads to a hydrophobic surface state, which avoids a native oxide layer to grow. Nevertheless, it was observed that, even with the HF treatment, only a low bonding energy was achieved in DSB applications and that defects were still present in the strained silicon applications, like for example, the so-called "watermarks".

SUMMARY OF THE INVENTION

It is therefore the object of the present invention to provide an improved semiconductor substrate surface preparation method with which the bonding energy can be enhanced in DSB applications and with which strained silicon crystalline layers can be achieved with improved crystalline quality.

This object is achieved by a method wherein, prior to removing the oxide from the surface of a semiconductor substrate (step b), an additional step (step a) of transforming the natural oxide into an artificial oxide is carried out beforehand.

Surprisingly, it was found out that, by transforming the natural oxide into an artificial oxide and subsequently removing the artificial oxide, superior hydrophobic surfaces were achieved so that the native oxide layer growth can be better suppressed compared to surface preparation methods using an HF treatment applied directly on the natural oxide.

Preferably, step b) can be a reducing step, in particular a liquid treatment, more in particular an HF treatment. Thus the same chemically reducing treatment as in the prior art can be used to remove the oxide and still the abovementioned improvements concerning the surface preparation can be achieved.

As an alternative or in addition, step b) can comprise a gaseous treatment, in particular a reducing plasma or a thermal treatment in a reducing atmosphere, to get rid off the artificial oxide. With a dry treatment the oxygen quantity on the surface of the substrate can also be reduced and improved bonding results have been observed compared to a liquid treatment.

Advantageously, the reducing plasma can comprise a reducing gas plasma and an inert gas plasma. The addition of an inert gas lead to improved surface roughness qualities compared to treatments without and thereby the bonding capabilities of the treated substrates can be further improved. Accordingly, a reducing plasma comprising, for instance, hydrogen and argon is suitable for realizing the inventive method.

According to a preferred embodiment, the semiconductor substrate can be a silicon (110) or a silicon (100) substrate or a silicon substrate with a SiGe buffer layer and a SiGe relaxed layer or a strained silicon layer. For this kind of semiconductor substrates, the inventive method leads to improved hydrophobic surfaces.

Advantageously, step a) can be carried out such that the natural oxide is turned into stoechiometric silicon dioxide. Thus, instead of treating a natural oxide, the composition of which is not stable, now by having turned the natural oxide into an artificial oxide of known chemical composition, namely silicon dioxide, an optimized oxide removal treatment can be applied such that the abovementioned improved hydrophobic surfaces can be achieved.

Preferably, the inventive method can further comprise a step c) of providing a strained silicon (sSi) layer over the oxide-free substrate surface. Thanks to the improved hydrophobic surface, in particular of the abovementioned relaxed SiGe layer underlying the strained silicon layer, the surface qualities of the strained silicon layer can be improved.

According to a further advantageous variant, the invention can comprise a step d) of attaching, in particular by bonding, the semiconductor substrate with its oxide-free substrate surface side to a second semiconductor substrate. Like already mentioned above, due to the improved hydrophobic surface qualities following the removal of the artificial oxide, the bonding energy can be optimized.

Preferably, the second semiconductor substrate can also have been treated according to the inventive method. Thus, with both surfaces being optimized, the bonding energy is further improved.

BRIEF DESCRIPTION OF THE DRAWINGS

Preferred embodiments of the invention are shown in the Figures and will be explained in detail in the following.

DETAILED DESCRIPTION OF THE INVENTION

Figure 1A:
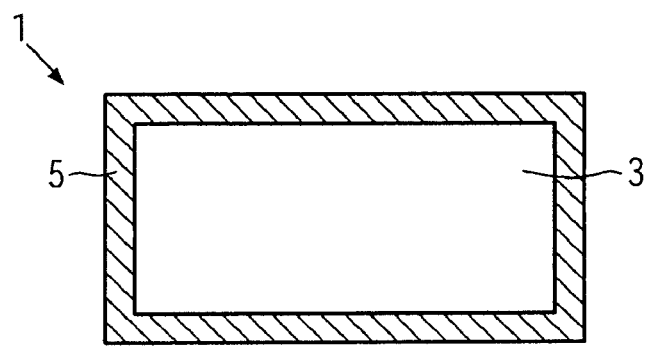
FIGS. 1a-1c illustrate a first inventive embodiment according to the invention.
Figure 1B:
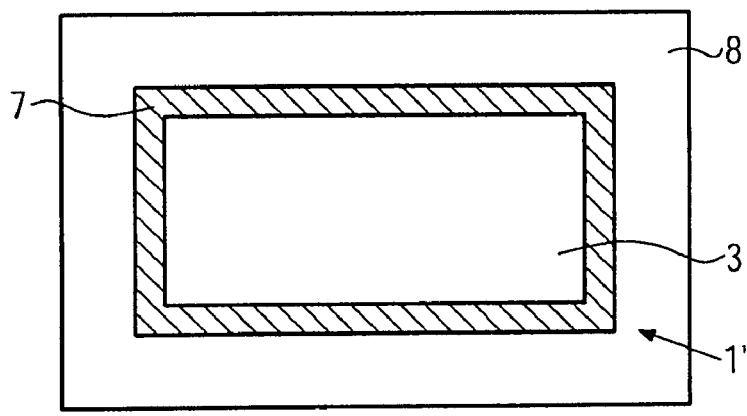
Figure 1C:
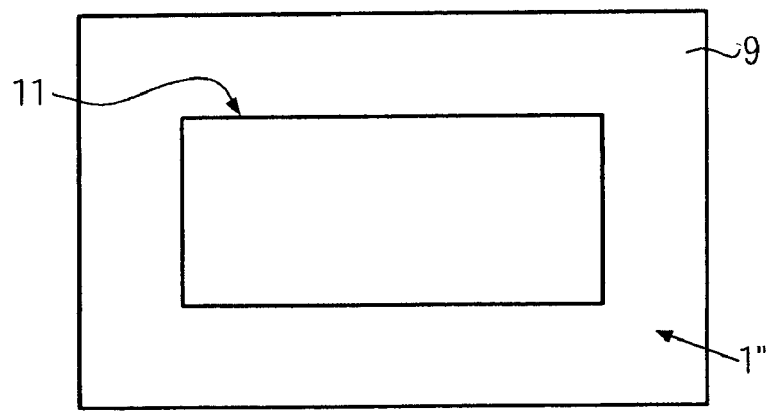

FIGS. 1a-1c illustrate a first inventive embodiment according to the invention, which deals with a method for preparing a surface of a semiconductor substrate 1. The treated substrate can then be used in subsequent fabrication methods.

First of all a semiconductor substrate 1 is provided. This semiconductor substrate 1 can, for example, be a silicon wafer with a (110) or a (100) substrate with or without further layers arranged thereon, like for example a silicon substrate with a silicon germanium buffer layer and/or a silicon germanium relaxed layer, typically the starting substrate for the growth of strained silicon layers.

The semiconductor substrate 1 has a semiconductor base 3 and its surfaces are covered with a natural oxide layer 5.

FIG. 1b illustrates a modified semiconductor substrate 1', as the result of step a) according to claim 1, according to which the semiconductor substrate is placed into an oxidizing environment 8 which changes the native oxide layer 5 into an artificial oxide layer 7, so that the semiconductor base 3 is then covered by the artificial oxide layer 7 instead of the natural oxide. Step a) is carried out such that at least on the wafer front side (in FIG. 1b, the upper main side of the substrate 1'), is completely turned into the artificial oxide.

The oxidizing step can be realized by a liquid oxidation, for example using ozone ($O_3$), or by a gaseous oxidation, for example using an oxygen plasma, or a thermal oxidation step. The oxidizing step is carried out such that the native oxide, the stoechiometry of which is usually unknown, is turned into an oxide of known stoechiometry. In the case of silicon oxide, the natural oxide $SiO_x$ is turned into $SiO_2$. Following the oxidation step, the artificial oxide layer 7 has a thickness of less than 150 Å, in particular less than 100 Å.

The transformation from the native oxide to the artificial oxide can be verified using standard analyzing techniques, like XPS (X-Ray Spectrometry).

The modified semiconductor substrate 1' is then placed into a reducing atmosphere 9 (see FIG. 1c which illustrates the final result of the next process step). This reducing step leads to the chemical removal of the artificial oxide layer 7 so that, in the end, a further modified semiconductor substrate 1" is achieved which presents an oxide-free substrate surface, thus essentially without the presence of Si—O or Si—OH bonds.

The reducing step to remove the artificial oxide can be realized using one of the following treatments or any combination thereof:

According to one alternative a liquid treatment, in particular using an HF treatment, is carried out to get rid of the artificial oxide layer 7. According to a second alternative a gaseous treatment, in particular a chemically reducing plasma or a thermal treatment in a reducing atmosphere, is applied. When using a chemically reducing plasma, it is preferable to combine the gas, which has the reducing role in the plasma, with an inert gas plasma, which protects the substrate surface from unnecessary material removal. As a consequence the surface of the further modified semiconductor substrate 1" remains smooth. For a silicon substrate an argon/$H_2$ plasma treatment lead to optimized results.

The artificial layer is removed from the main surface in case of the plasma treatment. In fact, the ion bombardment coming from the plasma acts on the wafer front side, as defined above. The backside surface is typically protected from the ion bombardment. In case of liquid treatment, the removal can occur on both sides like illustrated in FIG. 1c).

The oxide-free surfaces achieved on the semiconductor substrate 1" have superior hydrophobic properties, thus surfaces preventing a regrowth of an oxide, compared to semiconductor substrates from which the natural oxide was removed. As a consequence, using this superior substrate 1", it becomes possible to obtain improved starting substrates for the subsequent fabrication processes.

Figure 2A:
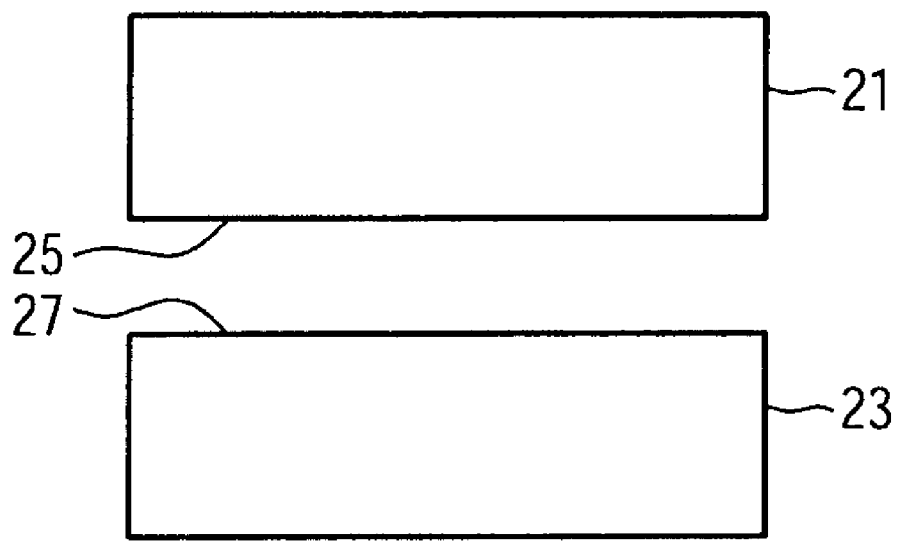
FIGS. 2a and 2b illustrate a second embodiment dealing with direct silicon bonding.
Figure 2B:
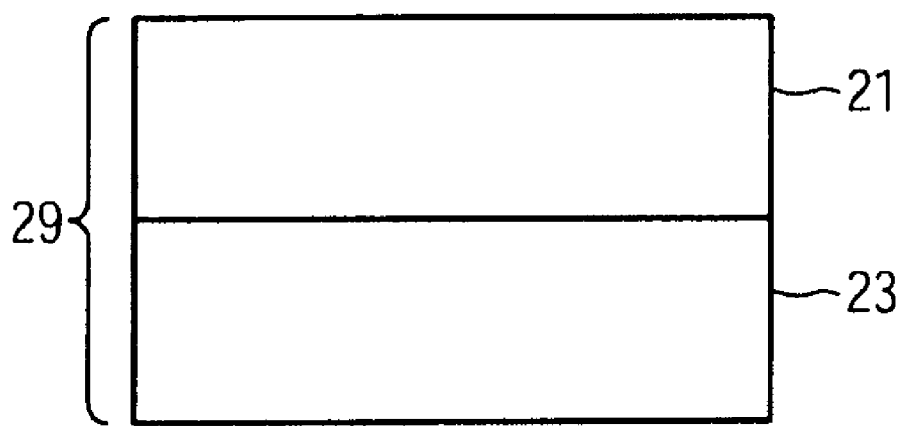

FIGS. 2a and 2b illustrate one inventive application using the improved semiconductor substrate 1", namely the direct silicon bonding of a silicon substrate 21 with a (100) surface and a silicon substrate 23 with a (110) substrate. In this embodiment, both substrates 21 and 23 have been treated like described with respect to FIGS. 1a-1c and, therefore present hydrophobic surfaces 25 and 27, which are essentially oxide-free.

As a next step the two substrates 21 and 23 are brought into contact and a slight pressure is applied so that a bonding wave is generated which spreads over the entire interface between the two substrates to thereby attach the two substrates 21, 23 to each other to form the direct bonded new substrate 29.

It was observed that the bonding energy, thus the energy which characterizes the strength of the attachment between the two substrates 21 and 23, was about a factor of at least 10 higher compared to the bonding energies of direct bonded substrates achieved from substrates from which the native oxide layer had been removed and not an artificial oxide layer.

| Sample | Plasma treatment | Bonding Energy room temperature (mJ/m²) |
| --- | --- | --- |
| Example 1 | Hydrogen Helium 250 W 10 s 50% He | 18 ± 3 |
| Example 2 | Hydrogen Helium 250 W 10 s 68% He | 15 ± 2 |
| Example 3 | Hydrogen Helium 250 W 10 s | 9 ± 2 |
| Example 4 | Hydrogen Argon 250 W 10 s 50% Ar | 4 ± 1 |
| inventive Example 5 | Oxygen 535 W 10 s H/Ar 250 W 60 s 18% Ar | 240 ± 46 |
| inventive Example 6 | Oxygen 535 W 10 s H/Ar 250 W 120 s 18% Ar | 185 ± 35 |

In the table, the bonding energy is represented for different reducing plasmas treatments. The method used to determine the bonding energy is the so-called crack-opening method, described in detail in Q.-Y. Tong & U. Gösele, "Semiconductor wafer bonding: science and technology", page: 25, 1999. The tests were actually carried for each kind of plasma treatment for a number of different time durations. However, Table 1 only provides the experimental results for which the best bonding energy results have been achieved.

As can be seen for Examples 1-4, which are examples that were not treated according to the invention, a bonding energy in the range of 4-18 mJ/m² was observed. For examples 5 and 6 treated according to the invention, thus for which first an oxygen treatment was carried out for 10 seconds to transform the native oxide into an artificial one and then a hydrogen argon plasma was applied to remove the artificial oxide, the bonding energy was between 185-240 mJ/m².

In conclusion, using the inventive method to provide an oxide-free semiconductor substrate surface, superior direct silicon bonding bonded substrates (like the DSB substrate 29) with a higher bonding energy are achievable.

FIGS. 3a-3i illustrate a third embodiment of the invention directed to preparing a strained silicon (sSi) on insulator semiconductor substrate, using the method illustrated in FIGS. 1a-1c to obtain an oxygen free surface.

The first step consists in providing a silicon substrate 31 (FIG. 3a), from which the oxide layer has been removed, either with the method according to the invention, thus turning the natural oxide into an artificial oxide and then removing it (see FIGS. 1a-1c) or with a prior art method consisting in simply removing the natural oxide.

Figure 3A:
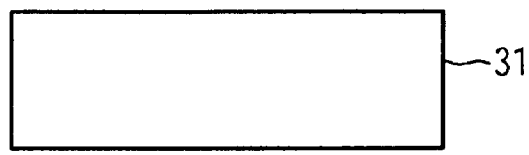
FIGS. 3a-3i illustrate a third embodiment of the invention directed to preparing a strained silicon on insulator substrate.
Figure 3B:
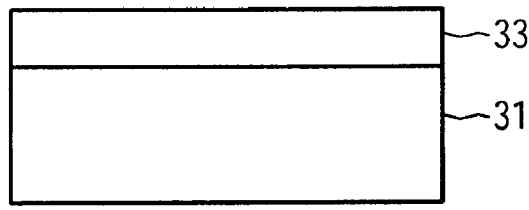

Then, a silicon germanium buffer layer 33 is provided over the semiconductor substrate 31 (FIG. 3b). In the buffer layer 33 the germanium content increases—linearly or by steps—to progressively change the lattice constants in the buffer layer 33.

Figure 3C:
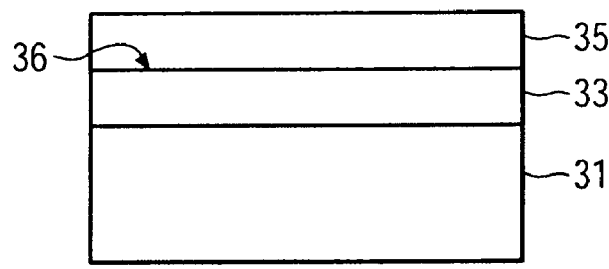

Subsequently, once the desired germanium content has been reached and which corresponds to a predetermined lattice constant at the surface of the buffer layer 33, a relaxed silicon germanium layer 35 with the germanium content of the buffer layer 33 at the buffer layer's interface 36 towards the relaxed layer 35 is grown (FIG. 3c).

Figure 3D:
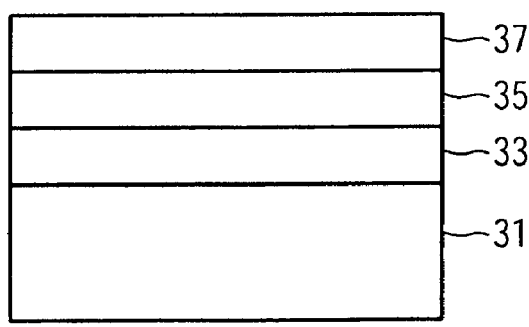

Then, a strained silicon layer 37 is deposited on the relaxed layer 35 (FIG. 3d). The strained silicon layer 37 adapts its lattice constant to the one of the underlying layer relaxed layer 35. Thus layer 37 has a lattice constant which is different to the one of natural silicon, which leads to its strained state. The strained silicon layer 37 is typically grown to a thickness of about 200 Å.

Figure 3E:
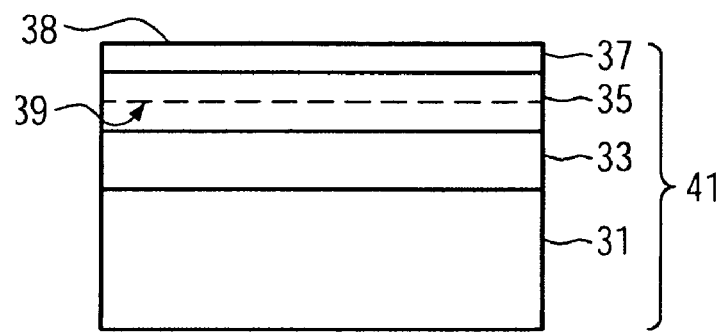
Figure 3F:
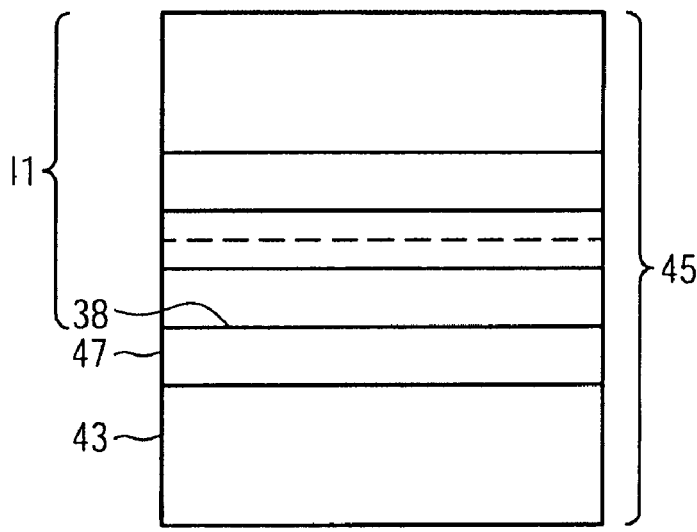
Figure 3G:
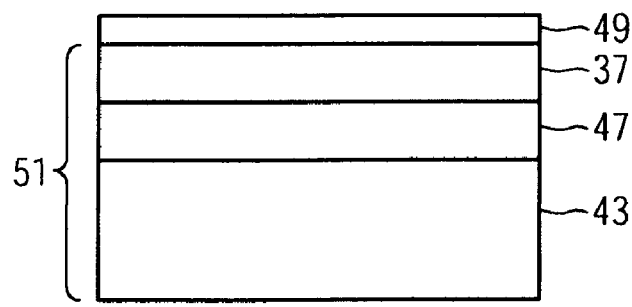
Figure 3H:
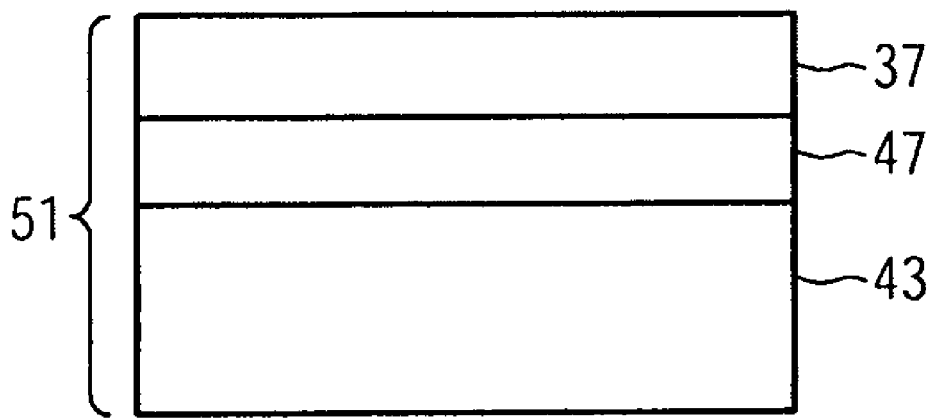
Figure 3I:
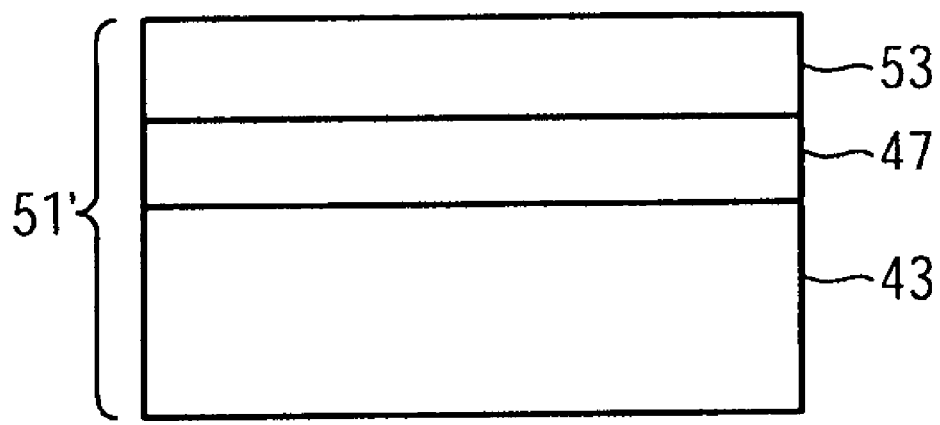

As illustrated in FIG. 3e, a predetermined splitting area 39 is then created inside the relaxed silicon germanium layer 35. This is achieved by implanting ions (e.g. Hydrogen and/or Helium ions) through the strained silicon layer 37.

Subsequently, the obtained structure 41 is attached, in particular be bonding, via the surface 38 of the strained silicon layer 37 to a carrier substrate 43 (see FIG. 3f) to thereby form a donor handle substrate 45. The carrier substrate can be any kind of substrate, in particular a silicon wafer. Here, the carrier substrate 43 comprises an oxide layer 47 on its surface.

Subsequently, a detachment step is carried out using e.g. a thermal or a mechanical treatment or a mixture thereof, to obtain a detachment at the predetermined splitting area 39. This leads to the transfer of the strained silicon layer 37, together with a part 49 of the relaxed silicon germanium layer 35, to obtain a strained silicon on insulator substrate 51 (FIG. 3g) still carrying the part 49 of the relaxed silicon germanium layer 35. This part 49 is then removed (FIG. 3h) to obtain the strained silicon on insulator substrate 51.

For certain applications, the strained silicon layer 37 with its thickness of about 200 Å is not sufficient and it becomes necessary to provide an additional strained silicon layer on the strained silicon layer 37 to obtain a greater thickness of the strained layer.

To achieve a thicker strained silicon layer 53 with a sufficient crystalline quality, it is necessary to remove any silicon oxide from the surface of the strained silicon layer 37. To do so the inventive method as described with respect to FIGS. 1a-1c, the description of which is not repeated again but incorporated by reference, is carried out. First the native oxide present on structure 51 is turned into an artificial one, which is then removed. By doing so, an improved hydrophobic surface is created on layer 37 which can then serve as the starting level for thickening the strained silicon layer to obtain the final substrate 51' with a thicker strained silicon layer 53.

What is claimed is:

1. A method for preparing a composite semiconductor substrate which comprises:
   providing an initial semiconductor substrate having an exposed surface of a natural oxide;
   oxidizing the exposed surface of the initial semiconductor substrate using an oxygen plasma to transform the natural oxide into an artificial oxide having a thickness of less than 100 Å and wherein the artificial oxide of the initial semiconductor substrate surface is stoichiometric $SiO_2$;
   after oxidizing the exposed surface of the initial semiconductor substrate, removing the artificial oxide with the use of a chemically reducing plasma comprising a reducing gas plasma comprising $H_2$ which has the reducing role in the plasma and an inert gas plasma comprising argon which protects the substrate surface from unnecessary material removal with the plasma applied for a time sufficient to remove the artificial oxide and obtain an oxide free substrate surface having improved hydrophobic properties;
   providing a second semiconductor substrate that has a free surface that contains natural oxide;
   oxidizing the free surface of the second semiconductor substrate using an oxygen plasma to transform the natural oxide into an artificial oxide having a thickness of less than 100 Å and wherein the artificial oxide of the second semiconductor substrate surface is stoichiometric $SiO_2$;
   after oxidizing the free surface of the second semiconductor substrate, removing the artificial oxide of the second semiconductor substrate with the use of a chemically reducing plasma comprising a reducing gas plasma comprising $H_2$ which has the reducing role in the plasma and an inert gas plasma comprising argon which protects the substrate surface from unnecessary material removal with the plasma applied for a time sufficient to remove the artificial oxide and obtain an oxide free substrate surface having improved hydrophobic properties; and
   after removing the artificial oxide of the initial semiconductor substrate and the second semiconductor substrate, direct molecular bonding of the oxide free hydrophobic substrate surface of the second semiconductor substrate to the oxide free hydrophobic substrate surface of the initial semiconductor substrate without an intervening silicon oxide layer to form a composite semiconductor substrate having a bonding energy of between 185-240 $mJ/m^2$.

2. The method according to claim 1, wherein the initial semiconductor substrate is a Si (110) or a Si (100) substrate.

3. The method according to claim 1, wherein the initial semiconductor substrate is a Si substrate that includes a SiGe buffer layer, a SiGe relaxed layer or a strained silicon layer.

* * * * *